United States Patent
Kim et al.

(10) Patent No.: US 9,444,423 B2
(45) Date of Patent: Sep. 13, 2016

(54) METHOD FOR ADJUSTING VOLUME AND ELECTRONIC DEVICE THEREOF

(71) Applicant: Samsung Electronics Co., Ltd, Gyeonggi-do (KR)

(72) Inventors: Yang-Su Kim, Gyeonggi-do (KR); Kyoung-Ho Bang, Seoul (KR); Beak-Kwan Son, Gyeonggi-do (KR); Keun-Won Jang, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 219 days.

(21) Appl. No.: 14/033,231

(22) Filed: Sep. 20, 2013

(65) Prior Publication Data

US 2014/0079227 A1 Mar. 20, 2014

(30) Foreign Application Priority Data

Sep. 20, 2012 (KR) ........................ 10-2012-0104580

(51) Int. Cl.
| | |
|---|---|
| *H03G 3/20* | (2006.01) |
| *H03G 7/00* | (2006.01) |
| *H04R 29/00* | (2006.01) |
| *H03G 3/32* | (2006.01) |
| *H04R 3/02* | (2006.01) |
| *H04M 1/60* | (2006.01) |

(52) U.S. Cl.
CPC .................. *H03G 7/00* (2013.01); *H03G 3/32* (2013.01); *H04M 1/605* (2013.01); *H04R 3/02* (2013.01); *H04R 29/001* (2013.01); *H04R 2430/01* (2013.01)

(58) Field of Classification Search
CPC ........ H03G 3/32; H03G 7/00; H03G 3/3005; H03G 3/22; H03G 3/301; H04M 9/082; H04M 1/6008; H04M 1/605; H04M 1/035; H04M 1/20; H04M 1/2535; G10L 21/0208; G10L 2021/02165; G10L 21/02; G10L 2021/02082; G10L 25/78; H04R 1/1083; H04R 5/04; H04R 2420/07; H04R 2430/01; H04R 3/00; H04R 3/005; H04R 5/02; H04R 2420/01
USPC ............ 381/107, 57, 66, 104, 74, 106, 71.1, 381/105, 108, 59, 71.6, 94.7, 1, 109, 119, 381/384, 56, 58, 72, 83, 92, 93, 96, 94.2, 381/103, 303, 71.11, 118, 120, 150, 17, 381/300, 306, 307, 309, 314, 318, 55, 9, 381/71.4, 71.8, 77, 89, 98, 99
See application file for complete search history.

(56) References Cited

U.S. PATENT DOCUMENTS

| | | | |
|---|---|---|---|
| 6,744,882 B1 | 6/2004 | Gupta et al. | |
| 7,908,134 B1* | 3/2011 | Felber | ........................... 704/205 |
| 8,965,011 B2* | 2/2015 | Helsloot | ................ H03G 7/002 |
| | | | 379/406.01 |
| 2007/0054638 A1* | 3/2007 | Song | ........................ H03F 3/217 |
| | | | 455/205 |
| 2010/0054456 A1* | 3/2010 | Ray | ......................... H03G 7/004 |
| | | | 379/420.01 |
| 2011/0188641 A1* | 8/2011 | Kim | ........................ H04M 3/22 |
| | | | 379/32.01 |

FOREIGN PATENT DOCUMENTS

| | | |
|---|---|---|
| JP | 2005086361 | 3/2005 |
| KR | 10-2005-0076959 | 7/2005 |
| KR | 10-2010-0095238 | 8/2010 |
| KR | 10-2011-0063001 | 6/2011 |

* cited by examiner

*Primary Examiner* — Akelaw Teshale

(57) ABSTRACT

An apparatus and method for selectively provide an automatic volume adjustment service considering an audio output signal in an electronic device. A method for adjusting a volume includes identifying a second signal which is output through a speaker while a first signal is input through a microphone, and determining whether a volume of an audio signal to be output through the speaker is increased, based on a correlation between the first signal and the second signal.

14 Claims, 9 Drawing Sheets

METHOD FOR ADJUSTING VOLUME AND ELECTRONIC DEVICE THEREOF

CROSS-REFERENCE TO RELATED APPLICATION(S) AND CLAIM OF PRIORITY

The present application is related to and claims priority under 35 U.S.C. §119(a) to a Korean Patent Application filed in the Korean Intellectual Property Office on Sep. 20, 2012 and assigned Serial No. 10-2012-0104580, the contents of which are herein incorporated by reference.

TECHNICAL FIELD

The present disclosure relates to an electronic device. More particularly, the present disclosure relates to a method for adjusting an output volume and the electronic device thereof.

BACKGROUND

When providing a call service, a portable electronic device can output a voice signal of a called party at a predetermined volume. If a surrounding noise of the portable electronic device is severe, there can be a problem that, because the surrounding noise masks an output signal of the portable electronic device, a user of the portable electronic device cannot recognize the output signal.

To solve the problem that the output signal is masked by the surrounding noise, the portable electronic device can provide an automatic volume adjustment service based on the surrounding noise. For example, when an audio signal is input through a microphone, the portable electronic device can identify a level of a surrounding noise included in the audio signal. And then, the portable electronic device can automatically set a volume of an output signal according to the level of the sounding noise.

However, because howling in which a signal output from a speaker flows into the microphone is recognized as a surrounding noise in the portable electronic device, when the portable electronic device provides the automatic volume adjustment service, there can be a problem that the howling brings about a continuous increase of the volume of the output signal.

SUMMARY

To address the above-discussed deficiencies of the prior art, it is a primary object to provide an apparatus and method for providing an automatic volume adjustment service in an electronic device.

Another aspect of the present disclosure is to provide an apparatus and method for selectively providing an automatic volume adjustment service based on howling in an electronic device.

A further aspect of the present disclosure is to provide an apparatus and method for, when an output signal flows through a microphone, limiting an automatic volume adjustment service in an electronic device.

Yet another aspect of the present disclosure is to provide an apparatus and method for selectively providing an automatic volume adjustment service based on a magnitude of an output signal in an electronic device.

The above aspects are achieved by providing a method for adjusting a volume and an electronic device thereof.

According to one aspect of the present disclosure, an operation method of an electronic device is provided. The method includes identifying a second signal which is output through a speaker while a first signal is input through a microphone, and determining whether a volume of an audio signal to be output through the speaker is increased, based on a correlation between the first signal and the second signal.

According to another aspect of the present disclosure, an operation method of an electronic device is provided. The method includes identifying a magnitude of a first signal which is output through a speaker, and determining whether a volume of an audio signal to be output through the speaker is increased, based on the magnitude of the first signal.

According to a further aspect of the present disclosure, an electronic device is provided. The device includes a microphone, a speaker, and an audio processor. The microphone receives an input of a signal. The speaker outputs a signal. The audio processor determines whether a volume of an audio signal to be output through the speaker is increased, based on a correlation between a first signal and a second signal which is output through the speaker while the first signal is input through the microphone.

According to yet another aspect of the present disclosure, an electronic device is provided. The device includes a microphone, a speaker, and an audio processor. The microphone receives an input of a signal. The speaker outputs a signal. The audio processor determines whether a volume of an audio signal to be output through the speaker is increased, based on a magnitude of a first signal which is output through the speaker.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1 through 9, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device. Preferred embodiments of the present disclosure will be described herein below with reference to the accompanying drawings. In the following description, well-known functions or constructions are not described in detail since they would obscure the disclosure in unnecessary detail. And, terms described below, which are defined considering functions in the present disclosure, can be different depending on user and operator's intention or practice. Therefore, the terms should be defined on the basis of the disclosure throughout this specification.

Below, the present disclosure describes a technology for selectively providing an automatic volume adjustment service considering an audio output signal in an electronic device.

In the following description, the electronic device can be a device such as a portable electronic device capable of providing a voice call service, a portable terminal, a mobile communication terminal, a Portable Digital Assistant (PDA), a laptop computer, a smart phone, a netbook, a television, a Mobile Internet Device (MID), an Ultra Mobile Personal Computer (UMPC), a tablet Personal Computer (PC), a desktop computer, a smart TV, and a wrist watch. Also, the electronic device may be any electronic device combining functions of two or more devices among the aforementioned devices.

Figure 1:
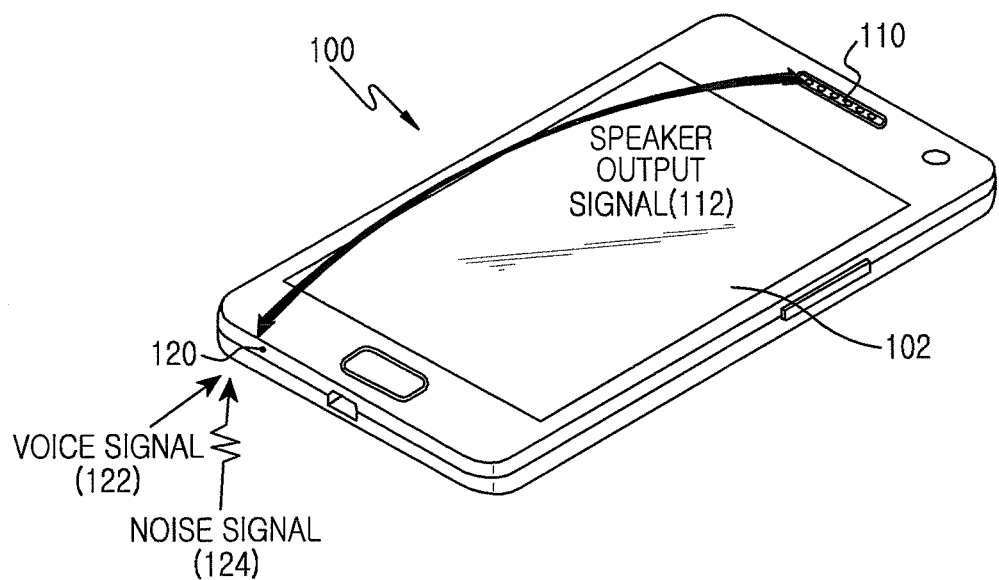
FIG. 1 illustrates an appearance construction of an electronic device according to the present disclosure.

FIG. 1 illustrates an appearance construction of an electronic device according to the present disclosure.

Referring to FIG. 1, the electronic device 100 has a display unit 102 which is installed to be exposed in front of the electronic device 100, an earpiece 110 for call which is installed at a top of the display unit 102, and a microphone 120 for call which is installed at a bottom of the display unit 102.

In a case of providing a call service using the electronic device 100, the electronic device 100 can output through the earpiece 110 a voice signal provided from a called party, and transmit a user's voice signal to the called party through the microphone 120.

To solve a problem that a user fails to recognize the voice signal of the called party owing to a surrounding noise 124, the electronic device 100 can automatically adjust an output volume of the earpiece 110 or external speaker according to a level of the surrounding noise 124 which flows through the microphone 120. That is, the electronic device 100 can provide an automatic volume adjustment service according to the level of the surrounding noise 124 which flows through the microphone 120. In an exemplary embodiment, the electronic device 100 can selectively provide the automatic volume adjustment service considering howling information. In detail, the electronic device 100 can have the inflow of a user's voice signal 122, the surrounding noise 124, and an output signal 112 (hereinafter, referred to as a "howling signal") of the electronic device 100. If the electronic device 100 recognizes as a noise the howling signal 112 which flows into the microphone 120, the electronic device 100 can increase the output volume owing to the howling signal 112, even when there is not the surrounding noise 124. According to this, when the howling signal 112 flows through the microphone 120, the electronic device 100 does not adjust the output volume. That is, the electronic device 100 can selectively provide the automatic volume adjustment service depending on the existence or absence of the howling signal 112 which flows through the microphone 120. Here, the howling represents a phenomenon in which a signal output through the earpiece 110 or an external speaker of the electronic device flows into the microphone 120.

Figure 2:
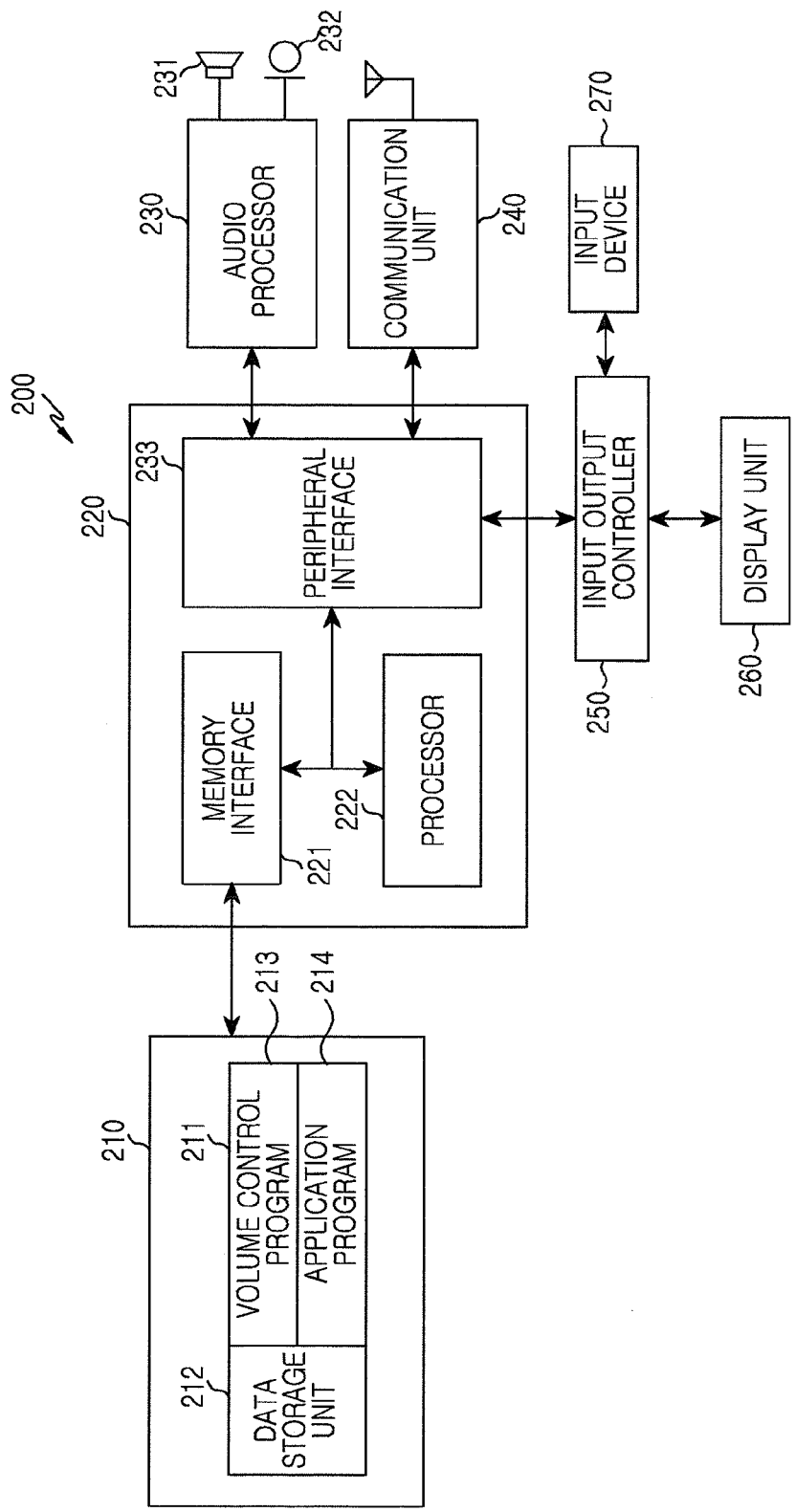
FIG. 2 illustrates a block diagram of an electronic device according to the present disclosure.

FIG. 2 illustrates a block diagram of an electronic device according to the present disclosure.

Referring to FIG. 2, the electronic device 200 can include a memory 210, a processor unit 220, an audio processor 230, a communication unit 240, an input output controller 250, a display unit 260, and an input device 270. Here, the memory 210 may exist in plural.

The memory 210 can include a program storage unit 211 storing a program for controlling an operation of the electronic device 200 and a data storage unit 212 storing data generated during program execution.

The data storage unit 212 can store a reference value for identifying the existence or absence of a howling signal in a volume control program 213.

The program storage unit 211 can include the volume control program 213 and at least one application program 214. Here, the program included in the program storage unit 211 is a set of instructions, and may be expressed as an instruction set.

The volume control program 213 can include at least one software constituent element for selectively providing an automatic volume adjustment service according to the existence or absence of a howling signal which flows through the microphone 232. For example, the volume control program 213 can selectively provide the automatic volume adjustment service using a correlation between a transmission signal flowing through a microphone 232 and a signal for outputting through a speaker 231. That is, when the correlation between the transmission signal flowing through the microphone 232 and the signal for outputting through the speaker 231 is greater than a reference value, the volume control program 213 can recognize that a howling signal has flowed through the microphone 232. In this case, the volume control program 213 can control not to provide the automatic volume adjustment service. Meantime, when the correlation between the transmission signal flowing through the microphone 232 and the signal for outputting through the speaker 231 is equal to or is less than the reference value, the volume control program 213 can recognize that the howling signal has not flowed through the microphone 232. In this case, by virtue of the automatic volume adjustment service, the volume control program 213 can adjust an output volume according to a surrounding noise which flows through the microphone 232. In an exemplary embodiment, the volume control program 213 can determine the correlation between the transmission signal flowing through the microphone 232 and the signal for outputting through the speaker 231 using any one of frequency characteristics of the transmission signal and the output signal, an autocorrelation scheme, and a pitch detection scheme. Here, the transmission signal can include at least one of an audio signal flowing through the microphone 232, a noise signal, and a howling signal.

The application program 214 can include a software constituent element for at least one application program installed in the electronic device 200.

The processor unit 220 can include a memory interface 221, at least one processor 222, and a peripheral interface 223. Here, the memory interface 221, the at least one processor 222, and the peripheral interface 223, which are included in the processor unit 220, can be integrated as at least one integrated circuit or realized as separate constituent elements.

The memory interface 221 can control the access of a constituent element such as the processor 222 or the peripheral interface 223 to the memory 210.

The peripheral interface 223 controls the connection of the processor 222 and the memory interface 221 with an input output peripheral device of the electronic device 200.

The processor 222 can control the electronic device 200 to provide various multimedia services using at least one software program. In an exemplary embodiment, the processor 222 can execute at least one program stored in the memory 210 and control to provide a service corresponding to the corresponding program. For example, the processor 222 can execute the volume control program 213 and control to selectively provide an automatic volume adjustment service. In detail, when the processor 222 recognizes that a howling signal has flowed through the microphone 232 according to a correlation between a transmission signal flowing through the microphone 232 and a signal for outputting through the speaker 231, the processor 222 can control not to provide the automatic volume adjustment service. Meantime, when the processor 222 recognizes that the howling signal has not flowed through the microphone 232 according to the correlation between the transmission signal flowing through the microphone 232 and the signal for outputting through the speaker 231, the processor 222 can control to provide the automatic volume adjustment service. In an exemplary embodiment, the processor 222 can determine the correlation between the transmission signal flowing through the microphone 232 and the signal for outputting through the speaker 231 using any one of frequency characteristics of the transmission signal and the output signal, an autocorrelation scheme, and a pitch detection scheme.

The audio processor 230 can provide an audio interface between a user and the electronic device 200 through the speaker 231 and the microphone 232. For example, in a case of providing a call service, the audio processor 230 can output through the speaker 231 a voice signal provided from a called party, and deliver to the called party an audio signal input through the microphone 232. Here, the speaker 231 can include at least one of an earpiece and an external speaker.

The communication unit 240 can provide a communication function for voice communication and data communication. In an exemplary embodiment, the communication unit 240 may be distinguished into a plurality of communication sub modules supporting different communication networks. For example, the communication network can include, though not limited to, a Global System for Mobile Communication (GSM) network, an Enhanced Data GSM Environment (EDGE) network, a Code Division Multiple Access (CDMA) network, a Wireless-Code Division Multiple Access (W-CDMA) network, a Long Term Evolution (LTE) network, an Orthogonal Frequency Division Multiple Access (OFDMA) network, a Wireless Local Area Network (WLAN), a Bluetooth network, a Near Field Communication (NFC) network and the like.

The input output controller 250 can provide an interface between the peripheral interface 223, and an input output device such as the display unit 260, the input device 270 and the like.

The display unit 260 can display status information of the electronic device 200, a character input by a user, a moving picture, a still picture and the like. If the display unit 260 is comprised of a touch screen, the display unit 260 may further include a touch input unit sensing touch information. At this time, the touch input unit can provide touch information by a touch pen or finger sensed through a touch panel, to the processor unit 220 through the input output controller 250.

The input device 270 can provide input data generated by user's selection, to the processor unit 220 through the input output controller 250. For example, the input device 270 is constructed including only a control button for control of the electronic device 200. For another example, the input device 270 may be composed of a keypad for receiving provision of input data from a user.

In the aforementioned exemplary embodiment, the processor 222 can execute software constituent elements stored in the program storage unit 211 within one module and control to selectively provide the automatic volume adjustment service.

Figure 3:
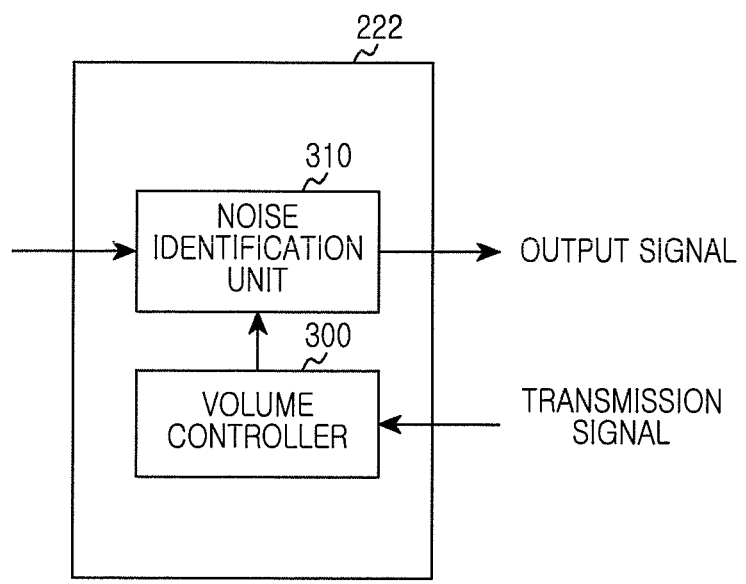
FIG. 3 illustrates a detailed block diagram of a processor according to an exemplary embodiment of the present disclosure.

In another exemplary embodiment, the processor 222 can include as separate modules constituent elements for controlling to selectively provide the automatic volume adjustment service as in FIG. 3.

FIG. 3 illustrates a detailed block diagram of a processor according to an exemplary embodiment of the present disclosure.

Referring to FIG. 3, the processor 222 can include a noise identification unit 300 and a volume controller 310.

The noise identification unit 300 can identify if a howling signal flows through the microphone 232. That is, the noise identification unit 300 can execute the volume control program 213 stored in the program storage unit 211 to identify if the howling signal flows through the microphone 232. In an exemplary embodiment, the noise identification unit 300 can identify if the howling signal flows through the microphone 232 in consideration of a correlation between a transmission signal flowing through the microphone 232 and a signal for outputting through the speaker 231. For example, the noise identification unit 300 can identify the correlation dependent on frequency characteristics of the transmission signal flowing through the microphone 232 and the signal for outputting through the speaker 231. For another example, the noise identification unit 300 can identify the correlation between the transmission signal flowing through the microphone 232 and the signal for outputting through the speaker 231 using an autocorrelation scheme. For further example, the noise identification unit 300 may identify the correlation between the transmission signal flowing through the microphone 232 and the signal for outputting through the speaker 231 using a pitch detection scheme. Here, the transmission signal can include at least one of an audio signal flowing through the microphone 232, a noise signal, and a howling signal.

The noise identification unit 300 can identify a level of a noise having flowed through the microphone 232. For example, the noise identification unit 300 can distinguish a user's voice signal and a noise signal using a Voice Activity Detection (VAD) scheme. After that, the noise identification unit 300 can identify a magnitude of the noise signal.

The volume controller 310 can control to selectively provide the automatic volume adjustment service according to howling signal inflow information provided from the noise identification unit 300. In an exemplary embodiment, the volume controller 310 can execute the volume control program 213 stored in the program storage unit 211 to selectively provide the automatic volume adjustment service according to the howling signal inflow information provided from the noise identification unit 300. For example, when the noise identification unit 300 recognizes that the howling signal has flowed through the microphone 232, the volume controller 310 can control not to provide the automatic volume adjustment service. For another example, when the noise identification unit 300 recognizes that the howling signal has not flowed through the microphone 232, the volume controller 310 can determine a volume amplification ratio of a signal for outputting through the speaker 231 according to a level of a surrounding noise provided from the noise identification unit 300.

In the aforementioned exemplary embodiment, the electronic device 200 can selectively provide the automatic volume adjustment service using the processor 222.

In another exemplary embodiment, the electronic device 200 may selectively provide the automatic volume adjustment service using the audio processor 230 constructed as in FIG. 4 below.

Figure 4:
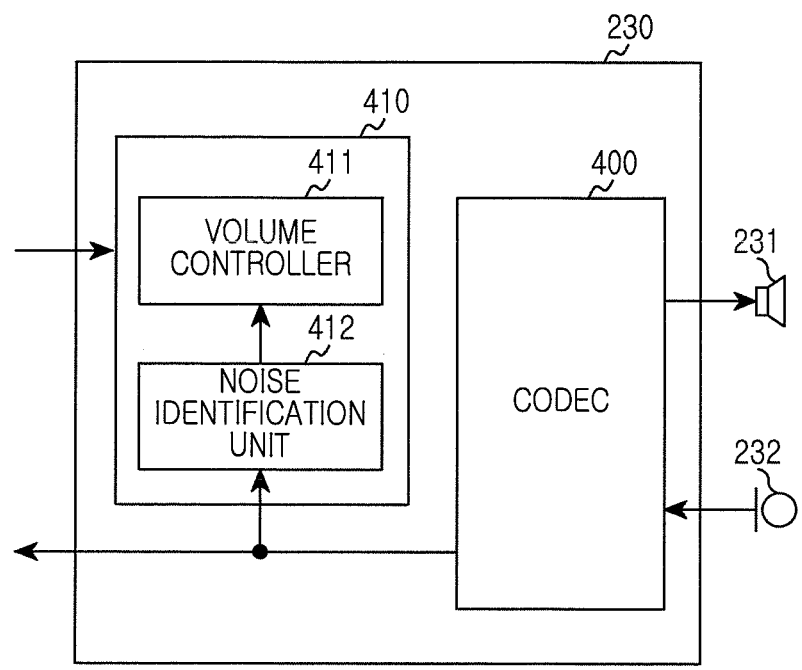
FIG. 4 illustrates a detailed block diagram of an audio processor according to an exemplary embodiment of the present disclosure.

FIG. 4 illustrates a detailed block diagram of a construction of an audio processor according to an exemplary embodiment of the present disclosure.

Referring to FIG. 4, the audio processor 230 can include a codec 400 and a volume adjustment controller 410.

The codec 400 can convert a digital signal provided from the processor unit 220 into an analog signal and output the analog signal through the speaker 231, and convert an analog signal flowing through the microphone 232 into a digital signal and provide the digital signal to the processor unit 220.

The volume adjustment controller 410 can selectively provide an automatic volume control service depending on the existence or absence of a howling signal. For example, the volume adjustment controller 410 can include a noise identification unit 412 and a volume controller 414.

The noise identification unit 412 can identify if a howling signal flows through the microphone 232. In an exemplary embodiment, the noise identification unit 412 can identify if the howling signal flows through the microphone 232 in consideration of a correlation between a transmission signal flowing through the microphone 232 and a signal for outputting through the speaker 231. For example, the noise identification unit 412 can identify the correlation dependent on frequency characteristics of the transmission signal flowing through the microphone 232 and the signal for outputting through the speaker 231. For another example, the noise identification unit 412 can identify the correlation between the transmission signal flowing through the microphone 232 and the signal for outputting through the speaker 231 using an autocorrelation scheme. For further example, the noise identification unit 412 may identify the correlation between the transmission signal flowing through the microphone 232 and the signal for outputting through the speaker 231 using a pitch detection scheme. Here, the transmission signal can include at least one of an audio signal flowing through the microphone 232, a noise signal, and a howling signal.

The noise identification unit 412 can identify a level of a noise having flowed through the microphone 232. For example, the noise identification unit 412 can distinguish a user's voice signal and a noise signal using a Voice Activity Detection (VAD) scheme. After that, the noise identification unit 412 can identify a magnitude of the noise signal.

The volume controller 414 can determine a volume amplification ratio for outputting through the speaker 231 according to howling signal inflow information provided from the noise identification unit 412. For example, when the noise identification unit 412 recognizes that the howling signal has flowed through the microphone 232, the volume controller 414 can control not to provide an automatic volume adjustment service. For another example, when the noise identification unit 412 recognizes that the howling signal has not flowed through the microphone 232, the volume controller 414 can determine a volume amplification ratio of a signal for outputting through the speaker 231 according to a level of a surrounding noise provided from the noise identification unit 412.

Figure 5:
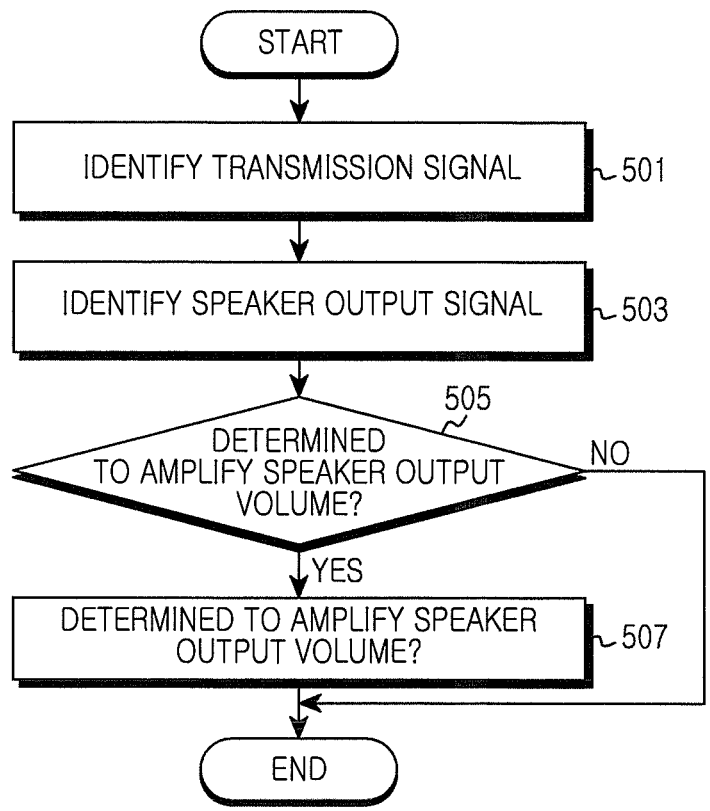
FIG. 5 illustrates a flowchart of a procedure for selectively providing an automatic volume adjustment service in an electronic device according to an exemplary embodiment of the present disclosure.

FIG. 5 illustrates a procedure for selectively providing an automatic volume adjustment service in an electronic device according to an exemplary embodiment of the present disclosure.

Referring to FIG. 5, in step 501, the electronic device can receive an input of a transmission signal through a microphone. For example, when providing a call service, the electronic device can identify a transmission signal input through a microphone 232. Here, the transmission signal can include at least one of an audio signal flowing through the microphone, a noise signal, and a howling signal.

After that, the electronic device proceeds to step 503 and can identify a signal output through a speaker at a time the transmission signal is input to the microphone. Here, the speaker can include at least one of an earpiece and an external speaker.

After identifying the transmission signal input through the microphone and the signal output through the speaker, the electronic device proceeds to 505 and can determine whether to amplify an output volume using the transmission signal input through the microphone and the signal output through the speaker. For example, the electronic device can identify a similarity between the transmission signal input through the microphone and the signal output through the speaker. If the transmission signal input through the microphone and the signal output through the speaker are similar to each other, the electronic device can recognize that a howling signal caused by the signal output through the speaker is included in the transmission signal input through the microphone. In this case, the electronic device can determine not to amplify the output volume. That is, the electronic device can recognize not to provide an automatic volume adjustment service. Meantime, when the transmission signal input through the microphone and the signal output through the speaker are not similar to each other, the electronic device can recognize that the howling signal caused by the signal output through the speaker is not included in the transmission signal input through the microphone. In this case, the electronic device can determine to amplify the output volume according to a magnitude of the noise signal. That is, the electronic device can recognize to provide the automatic volume adjustment service.

If determining not to amplify the output volume in step 505, the electronic device can terminate the algorithm according to the present disclosure.

Meantime, if determining to amplify the output volume in step 505, the electronic device proceeds to step 507 and can amplify a volume of a signal for outputting through the speaker, in consideration of the magnitude of the noise signal included in the transmission signal input through the microphone. For example, the electronic device can determine a volume amplification ratio considering the magnitude of the noise signal included in the transmission signal input through the microphone. After that, the electronic device can amplify a volume of a voice signal of a called party according to the volume amplification ratio, and output the amplified volume through the speaker.

Figure 6:
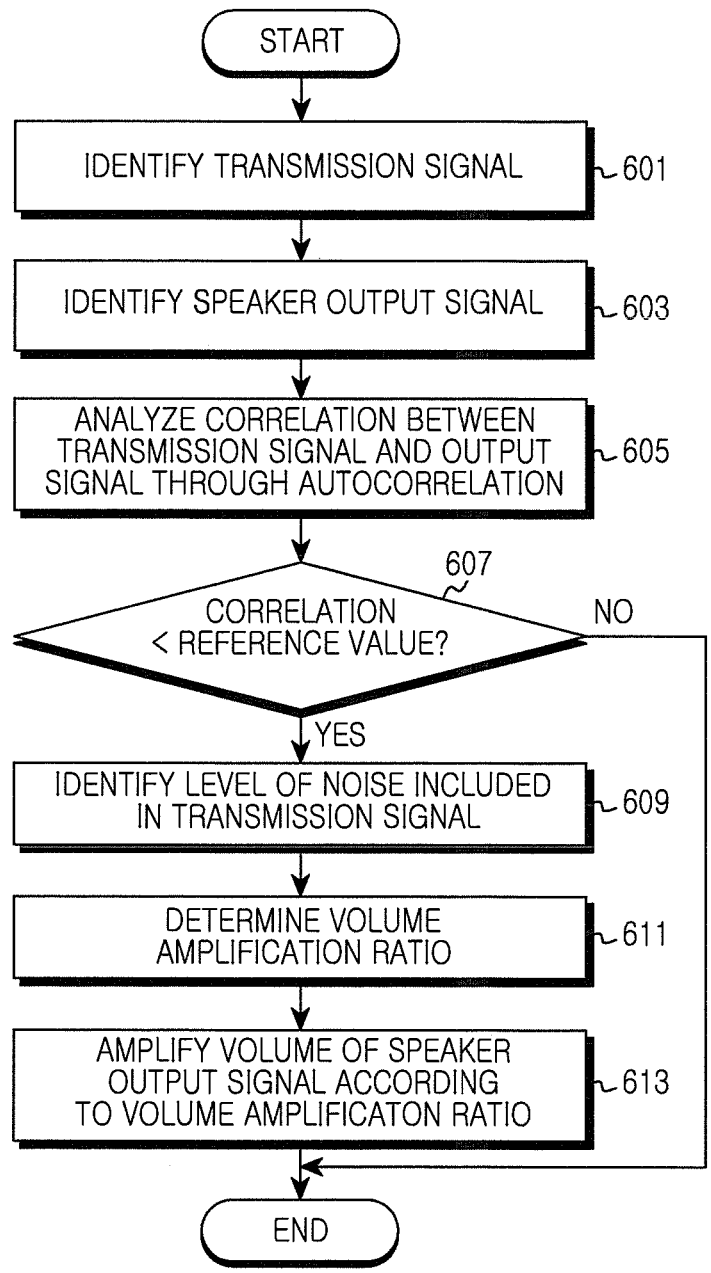
FIG. 6 illustrates a flowchart of a procedure for selectively providing an automatic volume adjustment service using an autocorrelation scheme in an electronic device according to an exemplary embodiment of the present disclosure.

FIG. 6 illustrates a procedure for selectively providing an automatic volume adjustment service using an autocorrelation scheme in an electronic device according to an exemplary embodiment of the present disclosure.

Referring to FIG. 6, in step 601, the electronic device can receive an input of a transmission signal through a microphone. For example, when providing a call service, the electronic device can identify a transmission signal input through a microphone 232. Here, the transmission signal can include at least one of an audio signal flowing through the microphone, a noise signal, and a howling signal.

After that, the electronic device proceeds to step 603 and can identify a signal output through a speaker at a time the transmission signal is input to the microphone. Here, the speaker can include at least one of an earpiece and an external speaker.

After identifying the transmission signal input through the microphone and the signal output through the speaker, the electronic device proceeds to step 605 and can analyze a correlation between the transmission signal and the output signal through autocorrelation.

After that, the electronic device proceeds to step 607 and can compare the correlation between the transmission signal and the output signal with a reference value to determine the provision or non-provision of an automatic volume adjustment service.

If the correlation between the transmission signal and the output signal is equal to or is greater than the reference value in step 607, the electronic device can recognize that a howling signal is included in the transmission signal input through the microphone. In this case, the electronic device can recognize not to provide the automatic volume adjustment service and terminate the algorithm according to the present disclosure.

Meantime, if the correlation between the transmission signal and the output signal is less than the reference value in step 607, the electronic device can recognize that the howling signal is not included in the transmission signal input through the microphone. In this case, the electronic device can provide the automatic volume control service of adjusting a volume of the signal output through the speaker according to a magnitude of a noise signal input through the microphone. In detail, when the howling signal is not included in the transmission signal input through the microphone, the electronic device proceeds to step 609 and can identify the magnitude of the noise signal included in the transmission signal input through the microphone in order to provide the automatic volume adjustment service. For example, the electronic device can distinguish a voice signal and the noise signal which are included in the user's transmission signal using a VAD scheme. Next, the electronic device can identify the magnitude of the noise signal.

After identifying the magnitude of the noise signal, the electronic device proceeds to step 611 and can determine a volume amplification ratio dependent on the magnitude of the noise signal. For example, the electronic device can select, in a volume amplification table, the volume amplification ratio corresponding to the magnitude of the noise signal identified in step 609. Here, the volume amplification table can include volume amplification ratio information based on a magnitude of each noise signal.

After determining the volume amplification ratio in step 611, the electronic device proceeds to step 613 and can amplify a volume of an output signal according to the volume amplification ratio. For example, when providing a call service, the electronic device can amplify a volume of a voice signal of a called party according to the volume amplification ratio determined in step 611, and output the amplified volume through the speaker.

Figure 7:
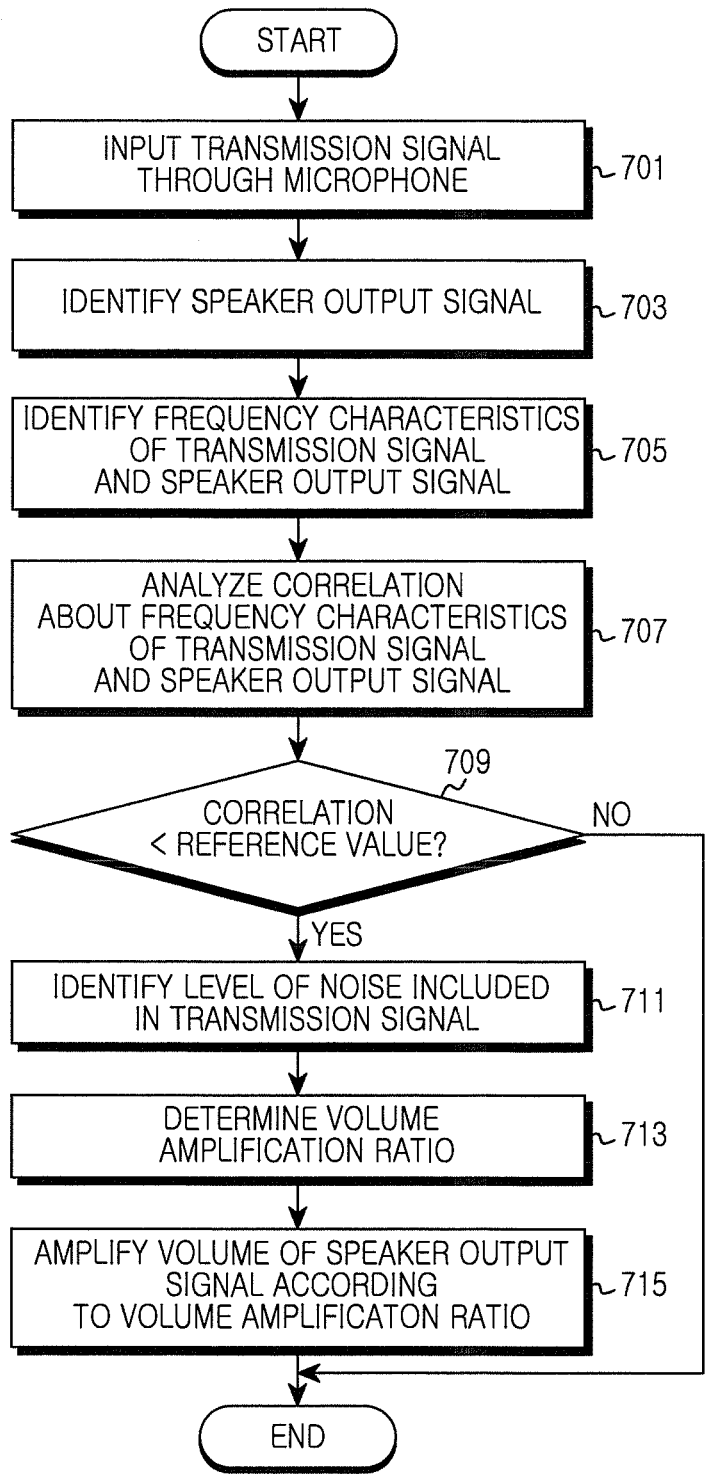
FIG. 7 illustrates a flowchart of a procedure for selectively providing an automatic volume adjustment service in consideration of a frequency characteristic of an audio signal in an electronic device according to an exemplary embodiment of the present disclosure.

FIG. 7 illustrates a procedure for selectively providing an automatic volume adjustment service in consideration of a frequency characteristic of an audio signal in an electronic device according to an exemplary embodiment of the present disclosure.

Referring to FIG. 7, in step 701, the electronic device can receive an input of a transmission signal through a microphone. For example, when providing a call service, the electronic device can identify a transmission signal input through a microphone 232. Here, the transmission signal can include at least one of an audio signal flowing through the microphone, a noise signal, and a howling signal.

After that, the electronic device proceeds to step 703 and can identify a signal output through a speaker at a time the transmission signal is input to the microphone. Here, the speaker can include at least one of an earpiece and an external speaker.

After identifying the transmission signal input through the microphone and the signal output through the speaker, the electronic device proceeds to step 705 and can identify frequency characteristics of the transmission signal input through the microphone and the signal output through the speaker. For example, the electronic device can identify the frequency characteristics of the transmission signal input through the microphone and the signal output through the speaker by means of Fast Fourier Transform.

After that, the electronic device proceeds to step 707 and can analyze a correlation of the frequency characteristics of the transmission signal input through the microphone and the signal output through the speaker.

After that, the electronic device proceeds to step 709 and can compare the correlation between the transmission signal and the output signal with a reference value to determine the provision or non-provision of an automatic volume adjustment service.

If the correlation between the transmission signal and the output signal is equal to or is greater than the reference value in step 709, the electronic device can recognize that a howling signal is included in the transmission signal input through the microphone. In this case, the electronic device can recognize not to provide the automatic volume adjustment service and terminate the algorithm according to the present disclosure.

Meantime, if the correlation between the transmission signal and the output signal is less than the reference value in step 709, the electronic device can recognize that the howling signal is not included in the transmission signal input through the microphone. In this case, the electronic device can provide the automatic volume control service of adjusting a volume of the signal output through the speaker according to a magnitude of a noise signal input through the microphone. In detail, when the howling signal is not included in the transmission signal input through the microphone, the electronic device proceeds to step 711 and can identify the magnitude of the noise signal included in the transmission signal input through the microphone in order to provide the automatic volume adjustment service. For example, the electronic device can distinguish a voice signal and the noise signal which are included in the user's transmission signal using a VAD scheme. Next, the electronic device can identify the magnitude of the noise signal.

After identifying the magnitude of the noise signal, the electronic device proceeds to step 713 and can determine a volume amplification ratio dependent on the magnitude of the noise signal. For example, the electronic device can select, in a volume amplification table, the volume amplification ratio corresponding to the magnitude of the noise signal identified in step 711. Here, the volume amplification table can include volume amplification ratio information based on a magnitude of each noise signal.

After determining the volume amplification ratio in step 713, the electronic device proceeds to step 715 and can amplify a volume of an output signal according to the volume amplification ratio. For example, when providing a call service, the electronic device can amplify a volume of a voice signal of a called party according to the volume amplification ratio determined in step 713, and output the amplified volume through the speaker.

Figure 8:
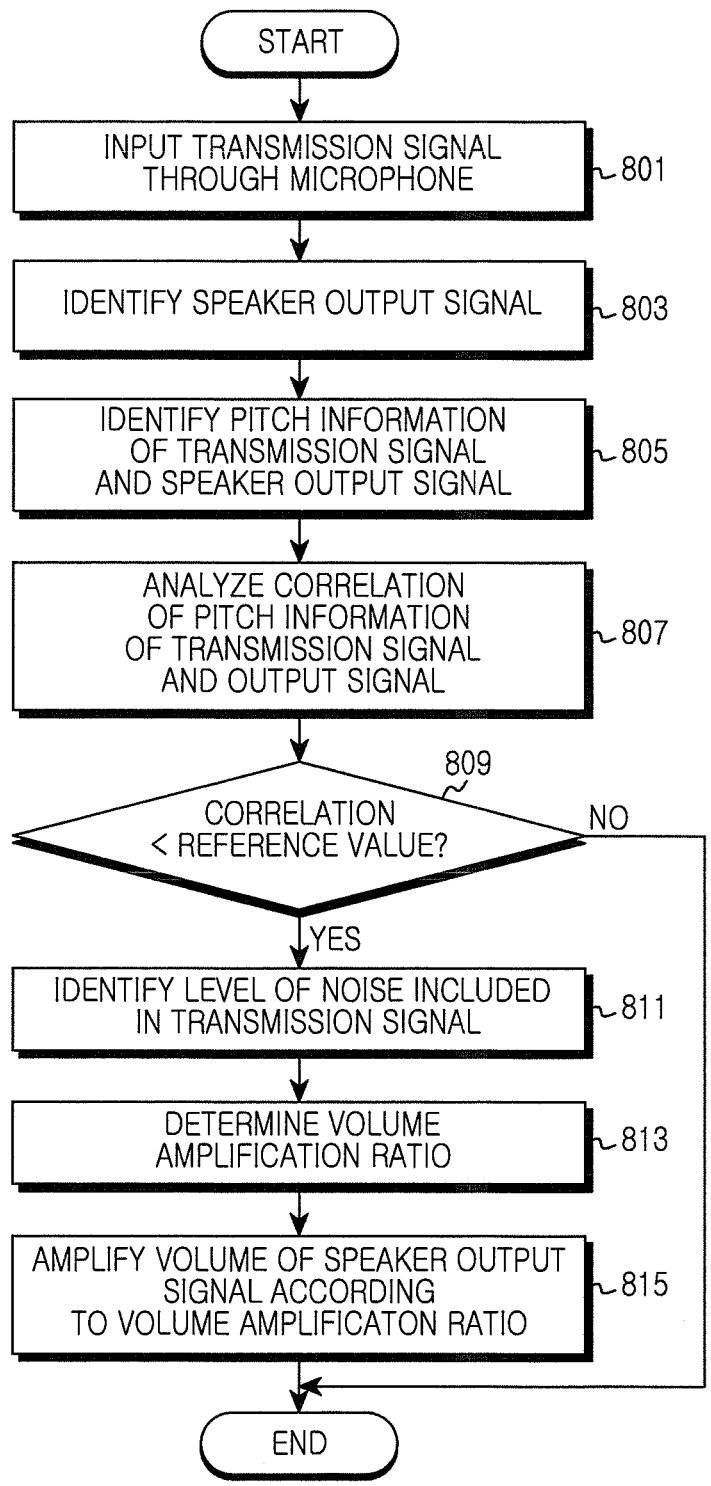
FIG. 8 illustrates is a flowchart of a procedure for selectively providing an automatic volume adjustment service using a pitch detection scheme in an electronic device according to an exemplary embodiment of the present disclosure.

FIG. 8 illustrates a procedure for selectively providing an automatic volume adjustment service using a pitch detection scheme in an electronic device according to an exemplary embodiment of the present disclosure.

Referring to FIG. 8, in step 801, the electronic device can receive an input of a transmission signal through a microphone. For example, when providing a call service, the electronic device can identify a transmission signal input through a microphone 232. Here, the transmission signal can include at least one of an audio signal flowing through the microphone, a noise signal, and a howling signal.

After that, the electronic device proceeds to step 803 and can identify a signal output through a speaker at a time the transmission signal is input to the microphone. Here, the speaker can include at least one of an earpiece and an external speaker.

After identifying the transmission signal input through the microphone and the signal output through the speaker, the electronic device proceeds to step 805 and can identify pitch information of the transmission signal input through the microphone and the signal output through the speaker. Here, the pitch information represents periods of voiced parts of the transmission signal and the output signal. That is, the audio signal is distinguished into a periodic voiced part and an aperiodic unvoiced part. Here, a period of the voiced part of the audio signal can be called the pitch information.

Next, the electronic device proceeds to step 807 and can analyze a correlation of the pitch information of the transmission signal input through the microphone and the signal output through the speaker.

After that, the electronic device proceeds to step 809 and can compare the correlation between the transmission signal and the output signal with a reference value to determine the provision or non-provision of an automatic volume adjustment service.

If the correlation between the transmission signal and the output signal is equal to or is greater than the reference value in step 809, the electronic device can recognize that a howling signal is included in the transmission signal input through the microphone. In this case, the electronic device can recognize not to provide the automatic volume adjustment service and terminate the algorithm according to the present disclosure.

Meantime, if the correlation between the transmission signal and the output signal is less than the reference value in step 809, the electronic device can recognize that the howling signal is not included in the transmission signal input through the microphone. In this case, the electronic device can provide the automatic volume control service of adjusting a volume of the signal output through the speaker according to a magnitude of a noise signal input through the microphone. In detail, when the howling signal is not included in the transmission signal input through the microphone, the electronic device proceeds to step 811 and can identify the magnitude of the noise signal included in the transmission signal input through the microphone in order to provide the automatic volume adjustment service. For example, the electronic device can distinguish a voice signal and the noise signal which are included in the user's transmission signal using a VAD scheme. Next, the electronic device can identify the magnitude of the noise signal.

After identifying the magnitude of the noise signal, the electronic device proceeds to step 813 and can determine a volume amplification ratio dependent on the magnitude of the noise signal. For example, the electronic device can select, in a volume amplification table, the volume amplification ratio corresponding to the magnitude of the noise signal identified in step 811. Here, the volume amplification table can include volume amplification ratio information based on a magnitude of each noise signal.

After determining the volume amplification ratio in step 813, the electronic device proceeds to step 815 and can amplify a volume of an output signal according to the volume amplification ratio. For example, when providing a call service, the electronic device can amplify a volume of a voice signal of a called party according to the volume amplification ratio determined in step 813, and output the amplified volume through the speaker.

After that, the electronic device can terminate the algorithm according to the present disclosure.

In the aforementioned exemplary embodiment, the electronic device can selectively provide the automatic volume adjustment service depending on whether the howling signal is included in the transmission signal.

Figure 9:
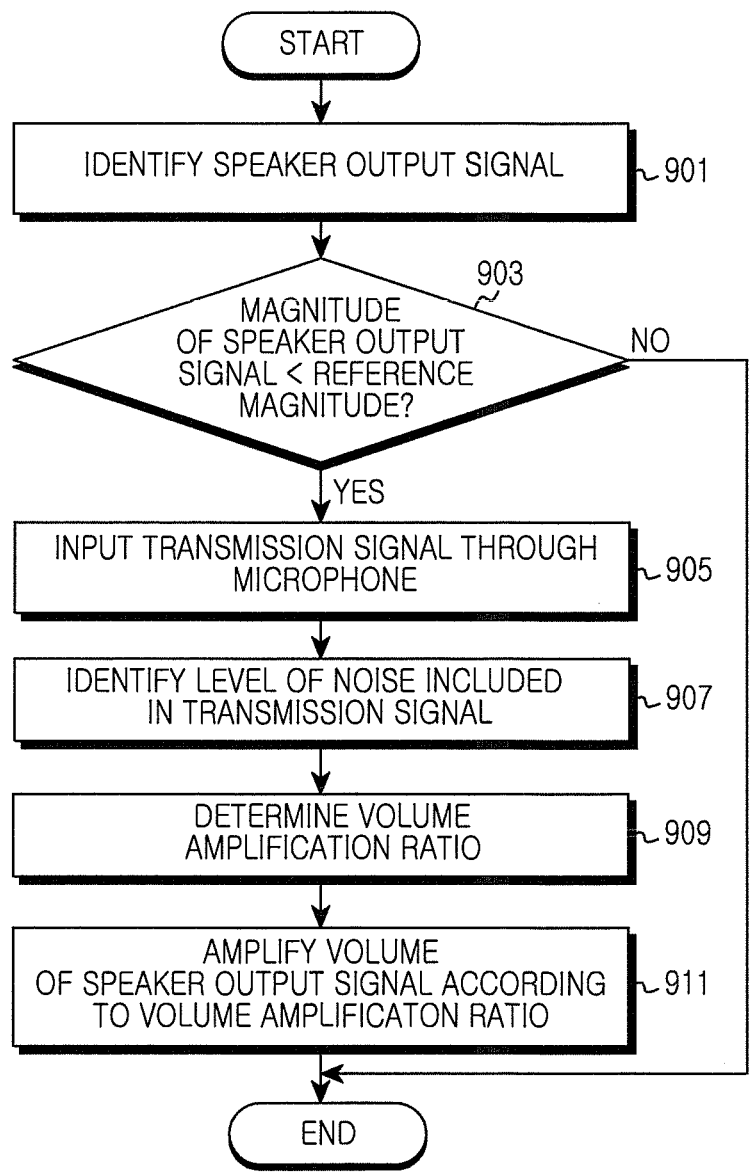
FIG. 9 illustrates a flowchart of a procedure for selectively providing an automatic volume adjustment service in consideration of a magnitude of an output signal in an electronic device according to an exemplary embodiment of the present disclosure.

In another exemplary embodiment, the electronic device may selectively provide the automatic volume adjustment service using a magnitude of the signal for outputting through the speaker as illustrated in FIG. 9 below.

FIG. 9 illustrates a procedure for selectively providing an automatic volume adjustment service in consideration of a magnitude of an output signal in an electronic device according to an exemplary embodiment of the present disclosure.

Referring to FIG. 9, in step 901, the electronic device can identify an audio signal for outputting through a speaker. For example, when providing a call service, the electronic device can identify a magnitude of a voice signal provided from a called party.

After that, the electronic device proceeds to step 903 and can compare a magnitude of the audio signal for outputting through the speaker with a reference magnitude to determine the provision or non-provision of an automatic volume adjustment service.

If the magnitude of the audio signal for outputting through the speaker is equal to or is greater than the reference magnitude in step 903, the electronic device can recognize that there is a high probability that a howling signal will be input through a microphone. In this case, the electronic device can recognize not to provide the automatic volume adjustment service, and terminate the algorithm according to the present disclosure.

Meantime, if the magnitude of the audio signal for outputting through the speaker is less than the reference magnitude in step 903, the electronic device can recognize that there is a low probability that the howling signal will be input through the microphone. In this case, the electronic device can provide the automatic volume control service of adjusting a volume of a signal output through the speaker depending on a magnitude of a noise signal input through the microphone. In detail, the electronic device proceeds to step 905 and receives an input of a transmission signal through the microphone. For example, when providing the call service, the electronic device can identify a transmission signal which is input through a microphone 232. Here, the transmission signal can include the audio signal and the noise signal which flow through the microphone.

Next, the electronic device proceeds to step 907 and can identify a magnitude of a noise signal included in the transmission signal input through the microphone. For example, the electronic device can distinguish a voice signal and the noise signal which are included in the user's transmission signal using a VAD scheme. Next, the electronic device can identify the magnitude of the noise signal.

After identifying the magnitude of the noise signal, the electronic device proceeds to step 909 and can determine a volume amplification ratio dependent on the magnitude of the noise signal. For example, the electronic device can select, in a volume amplification table, the volume amplification ratio corresponding to the magnitude of the noise signal identified in step 907. Here, the volume amplification table can include volume amplification ratio information based on a magnitude of each noise signal.

After determining the volume amplification ratio in step 909, the electronic device proceeds to step 911 and can amplify a volume of an output signal according to the volume amplification ratio. For example, when providing a call service, the electronic device can amplify a volume of a voice signal of a called party according to the volume amplification ratio determined in step 909, and output the amplified volume through the speaker.

As above, the electronic device can selectively provide an automatic volume control service in consideration of a magnitude of a signal for outputting through a speaker. In this case, the electronic device can selectively provide the automatic volume control service in consideration of the magnitude of the signal for outputting through the speaker, using the audio processor 230 illustrated in FIG. 2.

As described above, exemplary embodiments of the present disclosure can have an advantage in which a user of an electronic device can perform a smooth call service with a called party even in an environment of severe surrounding noise, by limiting an automatic volume adjustment service when an output signal flows through a microphone or there is a high possibility of doing so in the electronic device.

While the disclosure has been shown and described with reference to certain preferred embodiments thereof, it will be understood by those skilled in the art that various changes in form and details may be made therein without departing from the spirit and scope of the disclosure as defined by the appended claims.

What is claimed is:

1. A method of operating an electronic device, the method comprising:
receiving a first signal through a microphone of the electronic device while a second signal is output through a speaker of the electronic device during a voice telecommunication; and
determining whether to amplify a volume of an audio signal to be output through the speaker during the voice telecommunication based on a similarity between the first signal and the second signal,
wherein the determining comprises non-amplifying of the volume of the audio signal when it is determined that the first signal and the second signal are similar.

2. The method of claim 1, wherein the voice communication is operating in a speaker-phone mode.

3. The method of claim 2, wherein the determining further comprises amplifying of the volume of the audio signal when it is determined that the first signal and the second signal are not similar.

4. The method of claim 2, further comprising:
analyzing the similarity between the first signal and the second signal; and
determining whether the first signal and the second signal are similar based on the analyzing.

5. The method of claim 4, wherein analyzing the similarity comprises identifying the similarity between the first signal and the second signal through autocorrelation about the first signal and the second signal.

6. The method of claim 4, wherein analyzing the similarity comprises verifying a similarity regarding pitch components of the first signal and the second signal.

7. The method of claim 1, further comprising:
in response to determining to amplify the volume of the audio signal, identifying a magnitude of a noise signal comprised in the first signal;
determining a volume amplification ratio dependent on the magnitude of the noise signal; and
amplifying the volume of the audio signal which is output through the speaker using the volume amplification ratio.

8. An electronic device comprising:
a microphone configured to receive an input of a signal;
a speaker configured to output a signal; and
an audio processor configured to receive a first signal through the microphone of the electronic device while a second signal is output through the speaker of the electronic device during a voice telecommunication, and determine whether to amplify a volume of an audio signal to be output through the speaker during the voice telecommunication based on a similarity between the first signal and the second signal,
wherein the audio processor configured to the determine non-amplifying of the volume of the audio signal when it is determined that the first signal and the second signal are similar.

9. The device of claim 8, wherein the device is operating in a speaker-phone mode.

10. The device of claim 9, wherein the audio processor is further configured to amplify of the volume of the audio signal when it is determined that the first signal and the second signal are not similar.

11. The device of claim 9, wherein the audio processor is further configured to:
   analyze the similarity between the first signal and the second signal; and
   determine whether the first signal and the second signal are similar based on the analyzing.

12. The device of claim 11, wherein the audio processor is configured to identify the similarity between the first signal and the second signal through autocorrelation about the first signal and the second signal.

13. The device of claim 11, wherein the audio processor is configured to identify a similarity regarding pitch components of the first signal and the second signal.

14. The device of claim 9, wherein, in response to determining to amplify the volume of the audio signal, the volume controller is configured to determine a volume amplification ratio based on a magnitude of a noise signal comprised in the first signal, and amplify the volume of the audio signal output through the speaker using the volume amplification ratio.

\* \* \* \* \*